(12) United States Patent
Lee et al.

(10) Patent No.: US 10,326,432 B2
(45) Date of Patent: Jun. 18, 2019

(54) HARMONIC MULTIPLIER ARCHITECTURE

(71) Applicant: INTERNATIONAL BUSINESS MACHINES CORPORATION, Armonk, NY (US)

(72) Inventors: Wooram Lee, Briarcliff Manor, NY (US); Bodhisatwa Sadhu, Fishkill, NY (US); Alberto Valdes Garcia, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 15 days.

(21) Appl. No.: 15/821,743

(22) Filed: Nov. 22, 2017

(65) Prior Publication Data

US 2019/0158075 A1    May 23, 2019

(51) Int. Cl.
| | |
|---|---|
| *H03B 19/00* | (2006.01) |
| *H03K 5/00* | (2006.01) |
| *H03K 7/08* | (2006.01) |
| *H03K 5/15* | (2006.01) |

(52) U.S. Cl.
CPC ........... *H03K 5/00006* (2013.01); *H03K 5/15* (2013.01); *H03K 7/08* (2013.01)

(58) Field of Classification Search
CPC ......... H03K 5/00006; H03K 5/15; H03K 7/08
USPC .................................................. 327/119, 120
See application file for complete search history.

(56) References Cited

U.S. PATENT DOCUMENTS

| | | | |
|---|---|---|---|
| 6,657,463 | B2 | 12/2003 | Velez |
| 7,495,484 | B1 | 2/2009 | Petrovic |
| 7,778,610 | B2 | 8/2010 | Staszewski et al. |
| 7,809,338 | B2 | 10/2010 | Tsfati |
| 8,258,877 | B2 * | 9/2012 | Goel ................... H03F 3/45188 327/154 |
| 8,369,820 | B2 | 2/2013 | Petrovic et al. |
| 2011/0227612 | A1 * | 9/2011 | Chiesa ................... H03B 27/00 327/119 |

(Continued)

OTHER PUBLICATIONS

Wu et al., "A Phase-Locked Loop With Injection-Locked Frequency Multiplier in 0.18-um CMOS for V-Band Applications," IEEE Transactions on Microwave Theory and Techniques, vol. 57, No. 7, Jul. 2009, 1629-1636.

(Continued)

*Primary Examiner* — Ryan Jager
(74) *Attorney, Agent, or Firm* — Intelletek Law Group, PLLC; Gabriel Daniel, Esq.

(57) ABSTRACT

A method and system of providing harmonic frequency multiplication are provided. An input signal having a frequency f, is received by a programmable timing circuit. A signal that is in phase with the input signal, is provided at the first output of the programmable timing circuit. A time delayed version of the input signal, having the frequency f, is provided at the second output of the programmable timing circuit. A signal having the frequency f, is provided at the output of a first buffer. A duty cycled controlled signal having the frequency f, is provided at the output of the second buffer. A frequency nf, where n is a positive integer, is provided at the output of the multiplier. A higher-order frequency multiplied signal based on the frequencies f and nf, is provided at the output of a mixer.

20 Claims, 12 Drawing Sheets

(56) References Cited

U.S. PATENT DOCUMENTS

2015/0008968 A1* 1/2015 Ma .................. H03K 5/1565
                                              327/175
2018/0145766 A1* 5/2018 Rohde ................ H04B 10/64

OTHER PUBLICATIONS

Kuo et al., "A K-band CMOS Quadrature Frequency Tripler Using Sub-Harmonic Mixer", IEEE MWCL, vol. 19, No. 12, Dec. 2009.

* cited by examiner

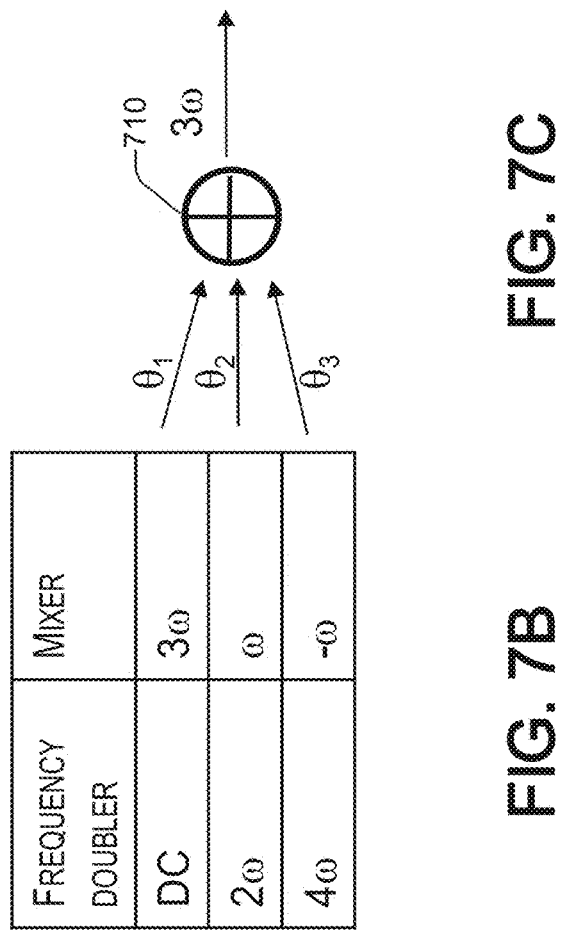
FIG. 7B
FIG. 7C
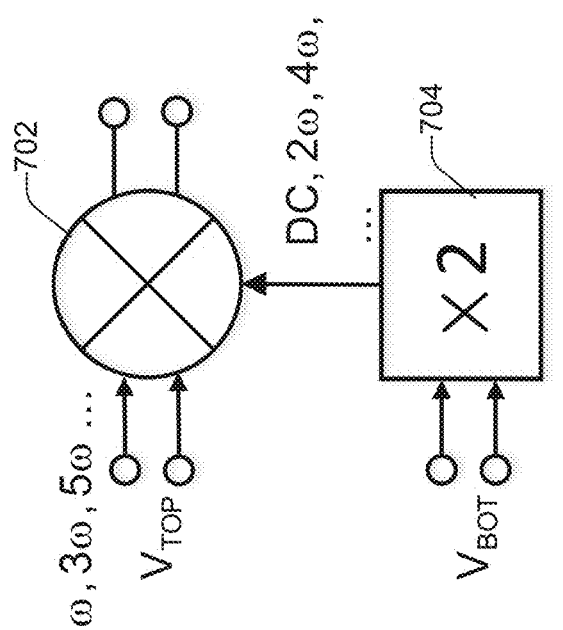
FIG. 7A

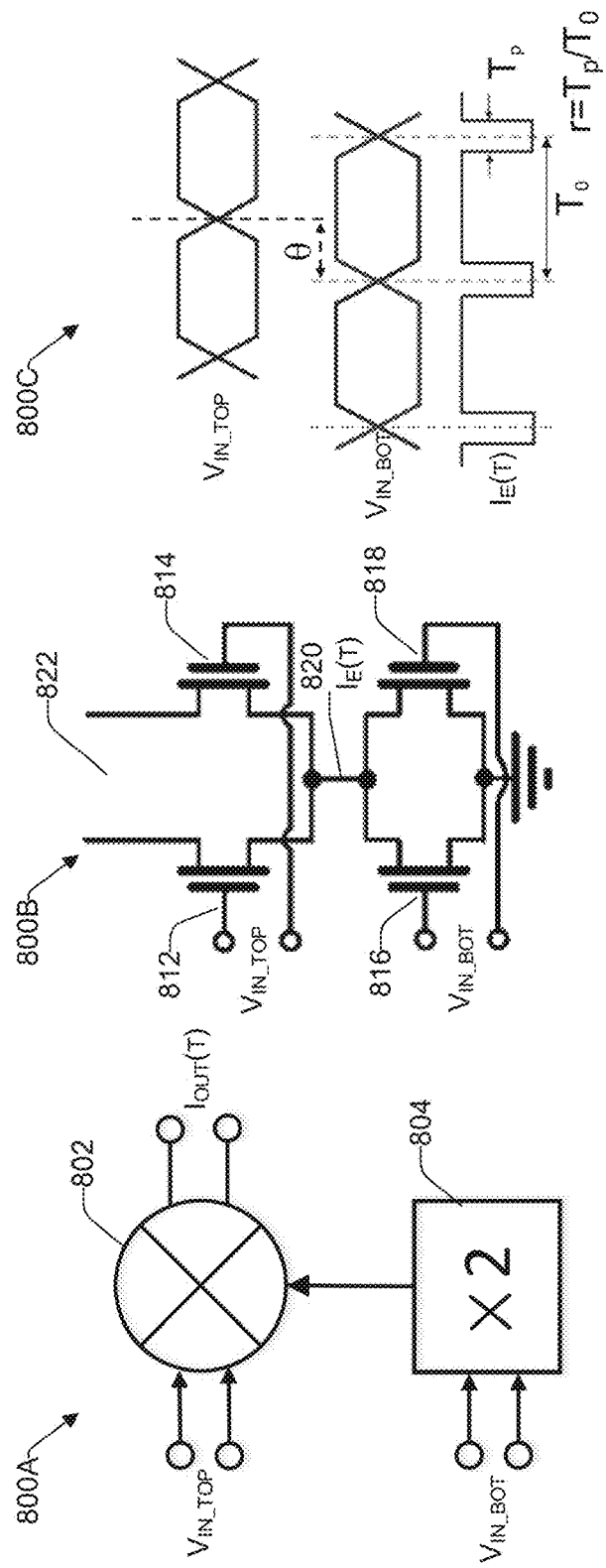

HARMONIC MULTIPLIER ARCHITECTURE

STATEMENT REGARDING FEDERALLY SPONSORED RESEARCH OR DEVELOPMENT

This application has been written with Government support under Contract No.: HR0011-12-C-0087 (Defense Advanced Research Projects Agency (DARPA)). The Government has certain rights in this invention.

BACKGROUND

Technical Field

The present disclosure generally relates to frequency multiplication, and more particularly, to systems and methods of multiplying frequency in broadband range.

Description of the Related Art

Frequency multipliers are common building blocks in frequency generation and synthesis circuits. A frequency multiplier is an electronic circuit that provides an output signal whose output frequency is a harmonic of its input frequency. Frequency multipliers can be implemented by using active or passive nonlinear devices. Active frequency multipliers rely on the nonlinearities of transistors or frequency up-conversion process of mixing operation. Considerations that are salient in frequency multiplier design include conversion gain, efficiency, and output spectral purity.

SUMMARY

According to an embodiment of the present disclosure, a harmonic frequency multiplier device is provided. There is a programmable timing circuit having an input configured to receive an input signal having a frequency f, a first output operative to provide a signal that is in phase with the input signal, and a second output that is operative to provide a signal that is a time delayed version of the input signal, having the frequency f. There is a first buffer having an input coupled to the first output of the programmable timing circuit and an output operative to provide a signal having the frequency f. There is a second buffer having an input coupled to the second output of the programmable timing circuit and an output configured to provide a duty cycled controlled signal having the frequency f. There is a frequency multiplier having an input coupled to the output of the second buffer, and an output operative to provide a frequency where n is a positive integer. There is a mixer having a first input coupled to the output of the first buffer, a second input coupled to the output of the frequency multiplier, and an output operative to provide a higher-order frequency multiplied signal based on the frequencies f and nf.

In one embodiment, the programmable timing circuit includes a broadband quadrature generation circuit configured to provide an in-phase output and a quadrature output based on the input signal, each having the frequency f. There is a first programmable delay circuit having an input coupled to the in-phase output of the broadband quadrature generation circuit and configured to provide the first output of the programmable timing circuit. There is a second programmable delay circuit having an input coupled to the quadrature output of the broadband quadrature generation circuit and configured to provide the second output of the programmable timing circuit.

According to an embodiment of the present disclosure, a method of providing harmonic frequency multiplication using programmable timing circuit, a first buffer coupled to a first output of the programmable timing circuit, a second buffer coupled to a second output of the programmable timing circuit, a frequency multiplier coupled to an output of the second buffer, and a mixer coupled to an output of the first buffer and an output of the multiplier, is provided. An input signal having a frequency f, is received by the programmable timing circuit. A signal that is in phase with the input signal, is provided at the first output of the programmable timing circuit. A time delayed version of the input signal, having the frequency f, is provided at the second output of the programmable timing circuit. A signal having the frequency f, is provided at the output of the first buffer. A duty cycled controlled signal having the frequency f, is provided at the output of the second buffer. A frequency nf, where n is a positive integer, is provided at the output of the multiplier. A higher-order frequency multiplied signal based on the frequencies f and nf, is provided at the output of the mixer.

According to one embodiment, the method further includes providing an in-phase output and a quadrature output based on the input signal, each having the frequency f, by a broadband quadrature generation circuit of the programmable timing circuit. The first output of the programmable timing circuit is provided by a first programmable delay circuit configured to receive the in-phase output of the broadband quadrature generation circuit. The second output of the programmable timing circuit is provided by a second programmable delay circuit configured to receive the quadrature output of the quadrature output of the broadband quadrature generation circuit.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 7A to 7C illustrate aspects of an example optimization of phase shift for maximum conversion gain.

FIG. 8A is a block diagram of a mixer configured to receive a first input and a second input via a multiplier.

FIG. 8B is a circuit implementation of the block diagram of FIG. 8A using metal oxide semiconductor devices, consistent with an illustrative embodiment.

FIG. 8C is a timing diagram related to the circuit implementation of FIG. 8B.

DETAILED DESCRIPTION

Overview

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The present disclosure generally relates to systems and methods of multiplying frequency in broadband range. By virtue of the concepts discussed herein, unwanted harmonics are suppressed while desired harmonics are provided, while maintaining a high conversion efficiency for a wide range of input frequency.

Figure 1:
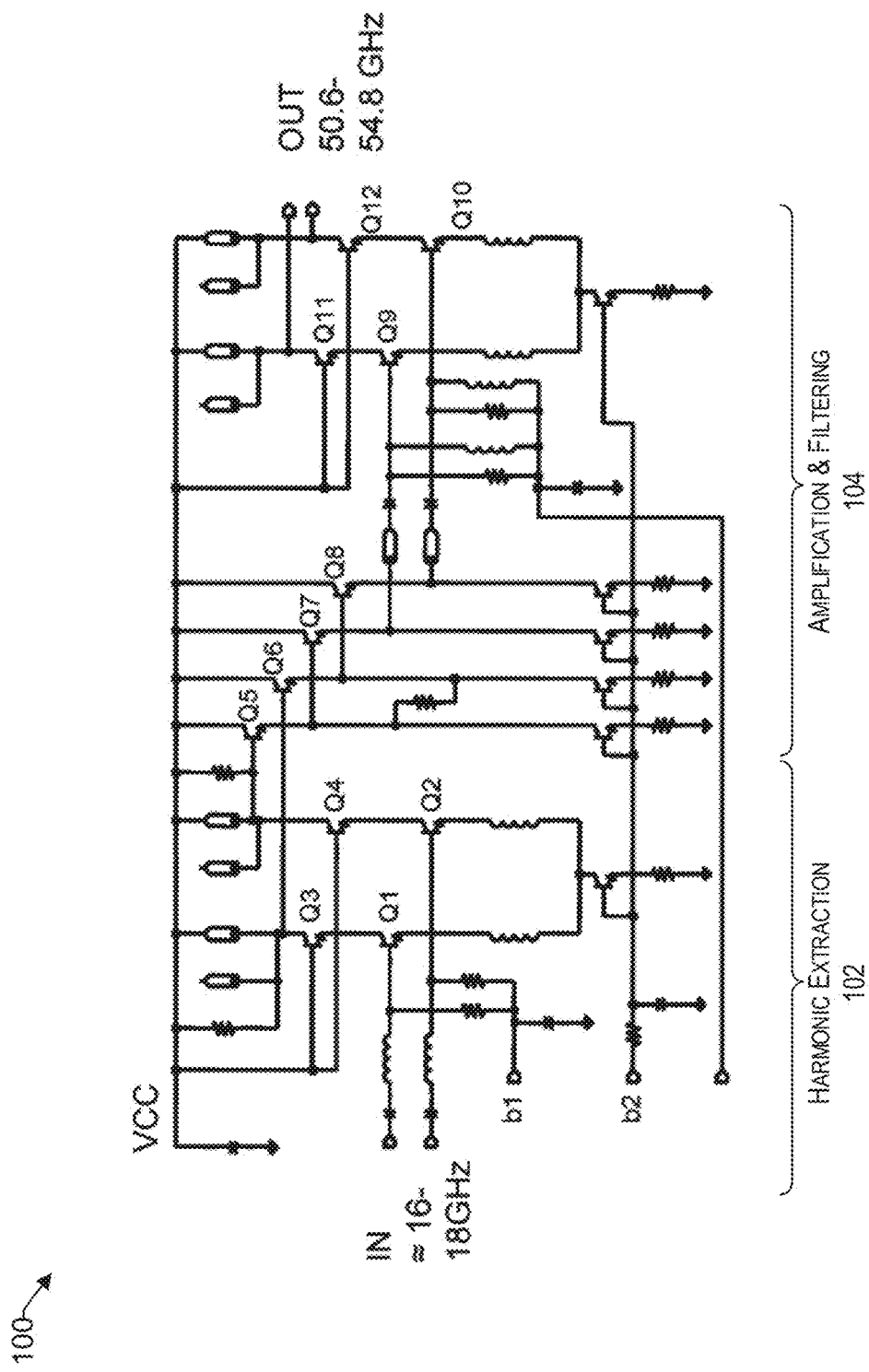
FIG. 1 illustrates a typical frequency tripler that is based on device non-linearity.

To better understand the features of the present disclosure, it may be helpful to discuss known architectures. To that end, FIG. 1 illustrates a typical frequency tripler 100 that is based on device non-linearity. It includes a harmonic extraction circuit 102, an amplification and filtering circuit 104 coupled to the harmonic extraction circuit 102. The topology of the frequency tripler 100 is not efficient to generate third-order harmonics especially when it is built with MOSFETs, which exhibit less transconductance non-linearity than bipolar junction transistors (BJTs). As used herein, higher efficiency means higher output power at tripled frequency for given input power at a fundamental frequency. Further, in the topology of the frequency tripler 100, it is challenging to suppress unwanted harmonics because high-Q frequency selection filters are not trivial to implement in silicon technology at high frequencies. In addition, high-Q selection filters only cover a limited range of frequency, which sometimes prevents the use of the technique of FIG. 1 for a broadband frequency application.

Figure 2:
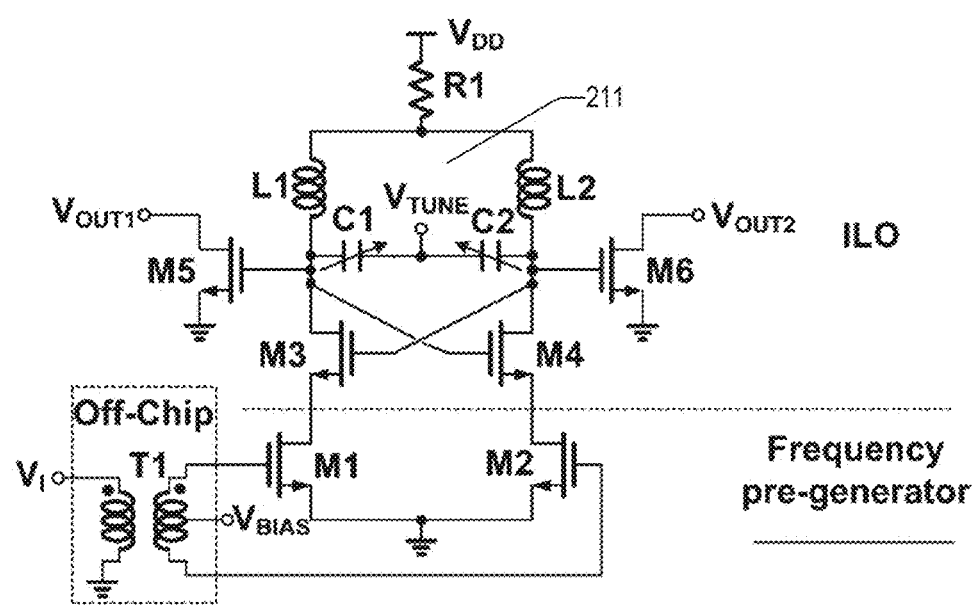
FIG. 2 illustrates a known injection-locking frequency tripler circuit.

FIG. 2 illustrates a known injection-locking frequency tripler circuit 200. Such frequency tripler circuit 200 can provide a high-power efficiency, defined as a ratio of output power at desired harmonic frequency to total input power comprising input power at fundamental frequency and DC power injected into the device. In addition, the unwanted harmonics are well suppressed due to resonance. However, it typically fails to accommodate a wide range of input frequency. That is because the circuit 200 has a resonator 211 at the top portion of the circuit (i.e., L1-C1 and L2-C2), whose quality factor limits the effective bandwidth of the circuit 200.

Figure 3:
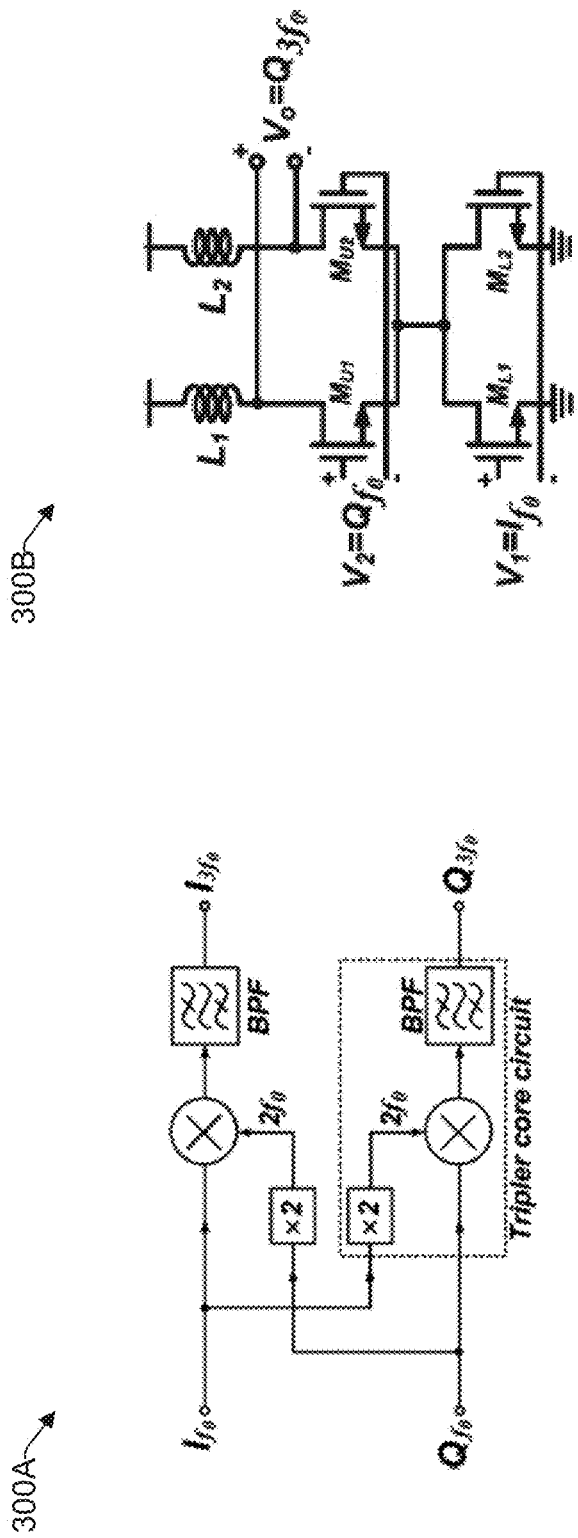
FIG. 3A illustrates a block diagram of a known frequency tripler based on a doubler and a mixer.
FIG. 3B illustrates a circuit implementation of a known frequency tripler based on a doubler and a mixer.

FIGS. 3A and 3B illustrate a known frequency tripler based on a doubler and a mixer. In particular, FIG. 3A illustrates a block diagram 300A and FIG. 3B illustrates a circuit implementation 300B. The architecture of FIGS. 3A and 3B typically does not suppress the fifth order harmonic, which is known to be the dominant unwanted harmonic for a broadband frequency, tripler. A common factor to determine the strength of such harmonic is the relative phase between the input signals to the tripler.

Example Architecture

Figure 4:
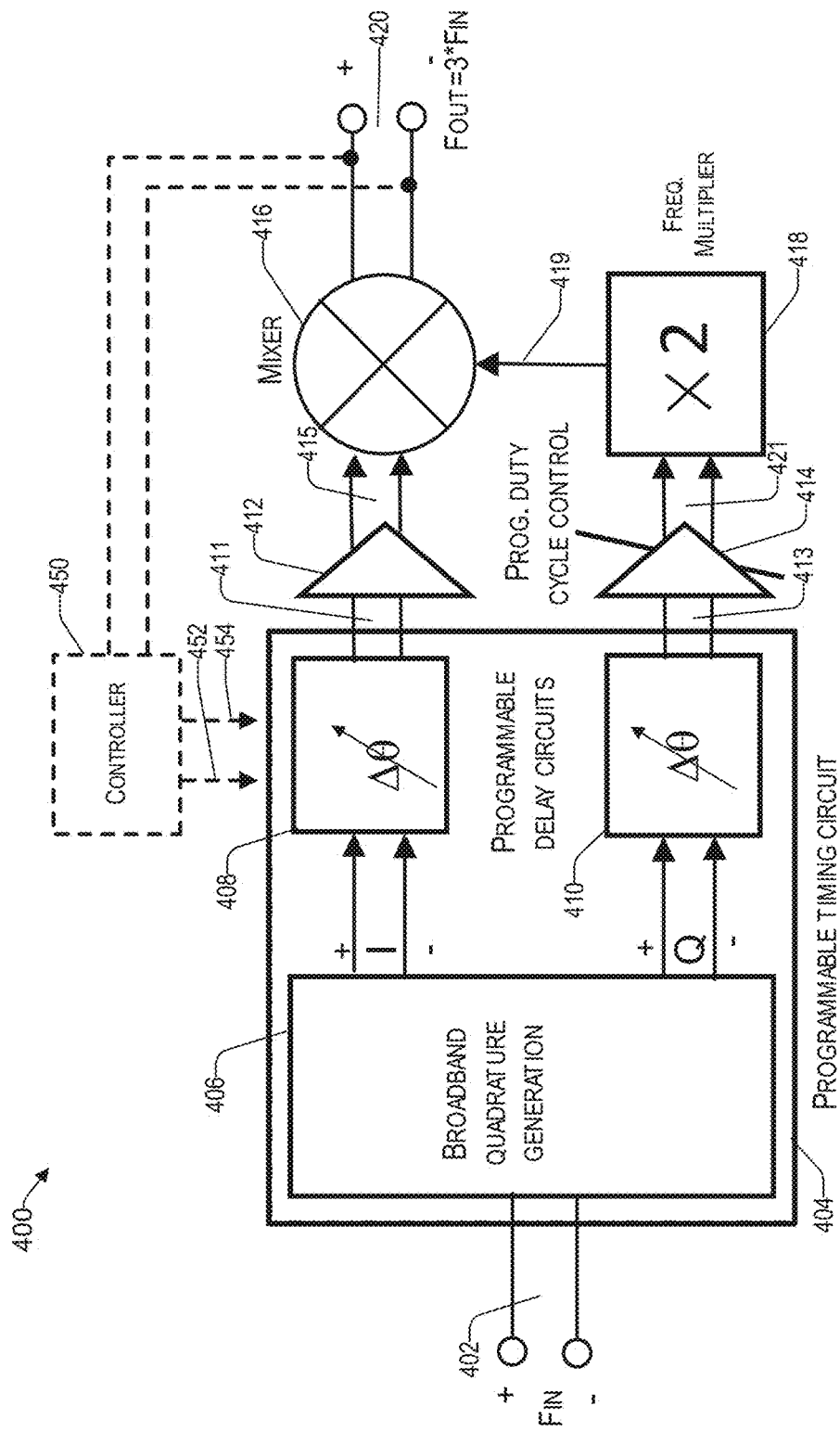
FIG. 4 illustrates a harmonic frequency multiplier, consistent with an exemplary embodiment.

Reference now is made to FIG. 4, which is a block diagram of a harmonic frequency, multiplier 400, consistent with an illustrative embodiment. By way of example only, and not by way of limitation, the harmonic frequency multiplier 400 is illustrated as a frequency tripler. It will be understood that other frequency multiples, both odd or even, are supported as well by the concepts discussed herein. The harmonic frequency multiplier 400 includes a programmable timing circuit 404 having an input 402, a first output 411 operative to provide an in-phase signal with a fine programmable delay set by delay circuit 408 and a second output 413 operative to provide a quadrature output with a fine programmable delay set by delay circuit 410. Thus, the programmable timing circuit 404 receives an input signal having a frequency f and generates first (i.e., at 411) and second (i.e., at 413) output signals at 411 and 413, respectively. The first output signal (i.e., at 411) has the frequency f and the second output (i.e., at 413) provides a time delayed version of the signal having the frequency f.

Both output signals 411 and 413 are time-delayed signals of the input. Ideally, output signals 411 and 413 should exhibit a 90-degree phase difference. However, in reality, this phase difference may vary in the presence of process variations during fabrication and wide-band quadrature generation. In this regard, in one embodiment, the deviation from the ideal 90-degree phase difference is compensated by delay circuits 408 and 410. In addition, the optimum phase at the output of circuits 408 and 410 may not be 90-degree due other phase shifts in the subsequent elements.

There is a first buffer 412 having an input coupled to the in-phase output 411 of the programmable timing circuit 404. There is a second buffer 414 having an input coupled to the quadrature output 413 of the programmable timing circuit 404. The second buffer 414 has a programmable duty cycle control. While in many applications it may be preferred to fix the first buffer 412 at a duty cycle of 50%, in one embodiment, the first buffer 412 has a programmable duty cycle control as well. Since the duty cycle affects the waveform shape of the transistor current in frequency multiplier 418, in one embodiment, the duty cycle is set to maximize the harmonic content in the transistor current at desired harmonic frequency. Thus, the first buffer 412 generates a first duty cycle controlled signal having the frequency f, based on the input signal $F_{IN}$ having the input frequency f. The second buffer 414 having the programmable duty cycle control, generates a second duty cycle controlled signal having the frequency f, from the time delayed version of the signal having the frequency f, There is a frequency multiplier 418 (i.e., doubler in the example of FIG. 4) having an input coupled to an output of the second buffer 413. Thus, the frequency multiplier receives the second duty cycle controlled signal 413 and generates a frequency multiplied signal having a frequency nf, wherein n is a positive integer.

There is a mixer 416 having a first input 415 coupled to an output of the first buffer 412, a second input 419 coupled to an output of the frequency multiplier 418, and an output $F_{OUT}$ 420 configured to provide an output signal at a frequency that is a multiple of the input frequency of the programmable timing circuit 404. Accordingly, the mixer 416 is a three-port passive or active device that acts as a frequency multiplier generating higher order harmonics at the output based on the frequency contents provided at its first input 415 and the second input 419 from the frequency multiplier 418. Thus, the mixer 416 receives both the first duty cycle controlled signal having the frequency f and the frequency multiplied signal having the frequency nf, and generates a higher-order frequency multiplied signal based on the frequencies f and nf. In the example of FIG. 4, the harmonic frequency multiplier 400 provides an output frequency that is triple its input frequency 402 (i.e., $F_{OUT}=3*F_{IN}$) when the frequency multiplier 418 is configured as a frequency doubler.

In one embodiment, the programmable timing circuit 404 includes a broadband quadrature generation circuit 406 configured to provide an in-phase output "I" and a quadrature output "Q" (i.e., out of phase by 90°) based on the input signal frequency f, sometimes referred to herein as the fundamental frequency, received at its input $F_{IN}$ 402. There is a first programmable delay circuit 408 having an input coupled to the in-phase output "I" of the broadband quadrature generation circuit 406 and configured to provide the first output 411 of the programmable timing circuit 404. There is a second programmable delay circuit 410 having an input coupled to the quadrature "Q" output of the broadband quadrature generation circuit 406 and configured to provide the second output 413 of the programmable timing circuit 404.

Accordingly, the output signal of the frequency multiplier (e.g., doubler) 418 is provided to the second input 419 of the mixer 416, where the mixer local oscillator (LO) input port (provided by the first input 415) and frequency multiplier (e.g., doubler) input 421 are driven by the same frequency, but with a different phase. In one embodiment, the phase difference is determined by the programmable timing circuit 404.

The first and second programmable delay circuits 408 and 410, respectively, are adjusted for at least one of: (i) a maximum conversion efficiency e.g., gain) and (ii) suppression of unwanted harmonics. For example, unwanted harmonics may include, without limitation, fifth order harmonics. The relative delay between two paths is relevant for both conversion efficiency and harmonic suppression. The actual control of the first and second programmable delay circuits 408 and 410 is discussed in more detail later.

In one embodiment, the duty cycle ratio provided to the frequency multiplier 1 doubler) 418 is adjusted by the second buffer 414 by controlling the duty cycle control for the maximum conversion efficiency. As to the programmable delay circuits 408 and 410, in one embodiment, they are adjusted such that a maximum conversion efficiency between the output signal frequency at $F_{OUT}$ 420 and the input signal frequency at $F_{IN}$ 402 is achieved.

In one embodiment, there is a controller 450 coupled to the output 420 to provide the optimization of the programmable delay circuits 408 and 410. For example, the controller 450 may comprise an on-chip or off-chip power detector configured to measure the magnitude of the output signal at desired harmonic frequency at output $F_{OUT}$ 420 within the relevant frequency range of the frequency multiplier 400. The programmable delay circuits 408 and 410 can then be adjusted by the controller outputs 452 and 454, respectively. Thus, in various embodiments, the programmable delay circuits 408 and 410 can be (i) actively programmed during operation or (ii) preprogrammed (e.g., during tuning operation in a lab or during fabrication). For example, the programmable delay circuits 408 and 410 may be adjusted for at least one of (i) the maximum conversion for the third-order harmonic frequency and (ii) minimum conversion for the fifth-order harmonic frequency. In various embodiments, the first order programmable delay circuit 408 can be controlled independently or only one delay circuit is controlled.

Example Even and Odd Harmonic Multiplication

Figure 5:
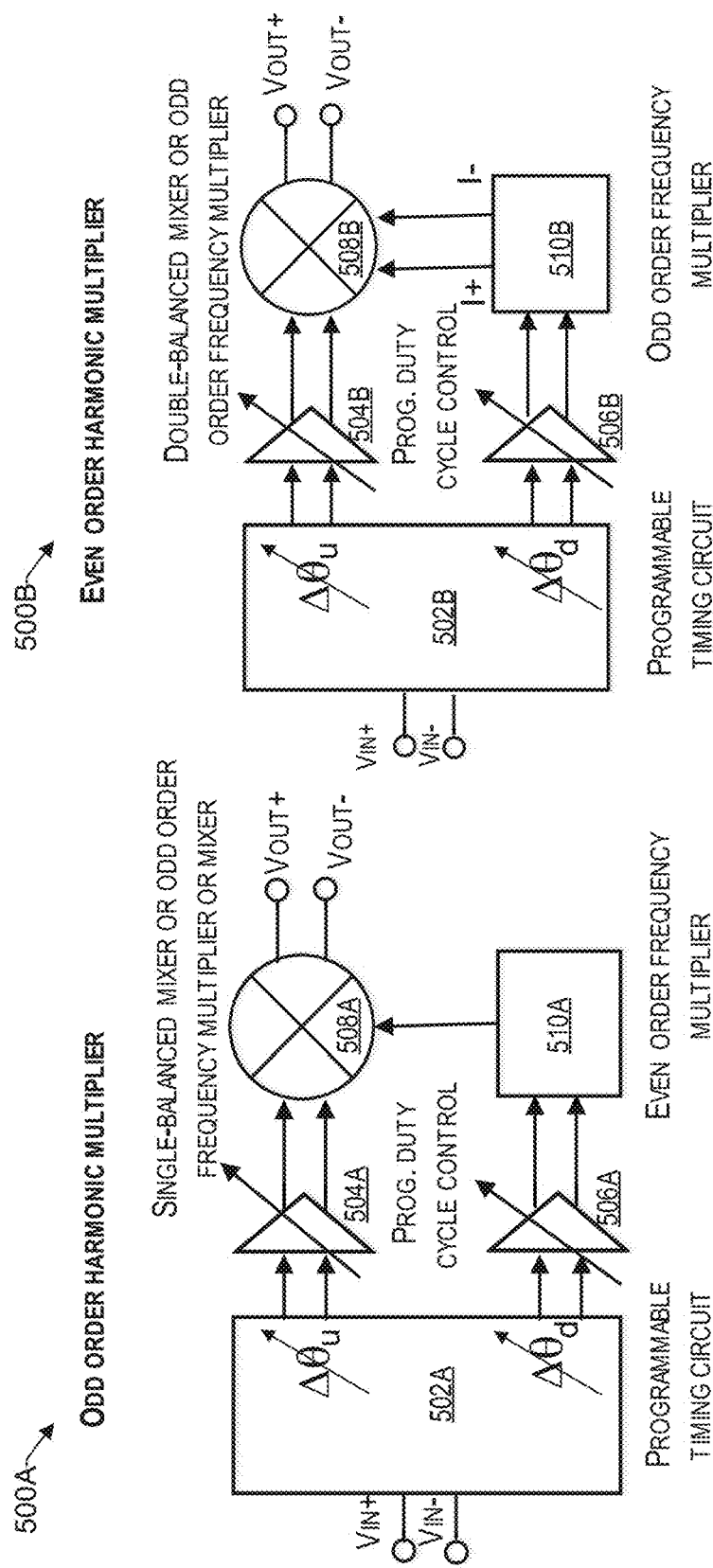
FIG. 5A is an odd harmonic multiplier, consistent with an illustrative embodiment.
FIG. 5B is an even harmonic multiplier, consistent with an illustrative embodiment.

FIGS. 5A and 5B illustrate an odd harmonic multiplier 500A and an even harmonic multiplier 500B, respectively, consistent with exemplary embodiments. FIG. 5A includes a programmable timing circuit 502A, a first buffer 504A coupled to an in-phase output of the programmable timing circuit, and a second buffer 506A coupled to the quadrature output of the programmable timing circuit 502A. To achieve odd harmonic multiplication, there is an even order frequency multiplier 510A. The mixer 508A is configured to provide a signal based on the signal received from the first buffer 504A and the even order frequency multiplier 510A. The mixer 508A may be a single-balanced mixer or an odd order frequency multiplier.

Regarding the even order harmonic multiplier 500B, its components are substantially similar to those of FIG. 5A and are therefore not repeated here, for brevity. In contrast to the odd order harmonic multiplier 500A, the even order harmonic multiplier has an odd order frequency multiplier 510B. In various embodiments, the mixer 508B is a double-balanced mixer. In this way, an even order harmonic multiplication can be achieved. Thus, by virtue of the concepts discussed herein, both odd and even harmonic multiplication can be achieved.

Example Feed-Forward Implementation

Figure 6:
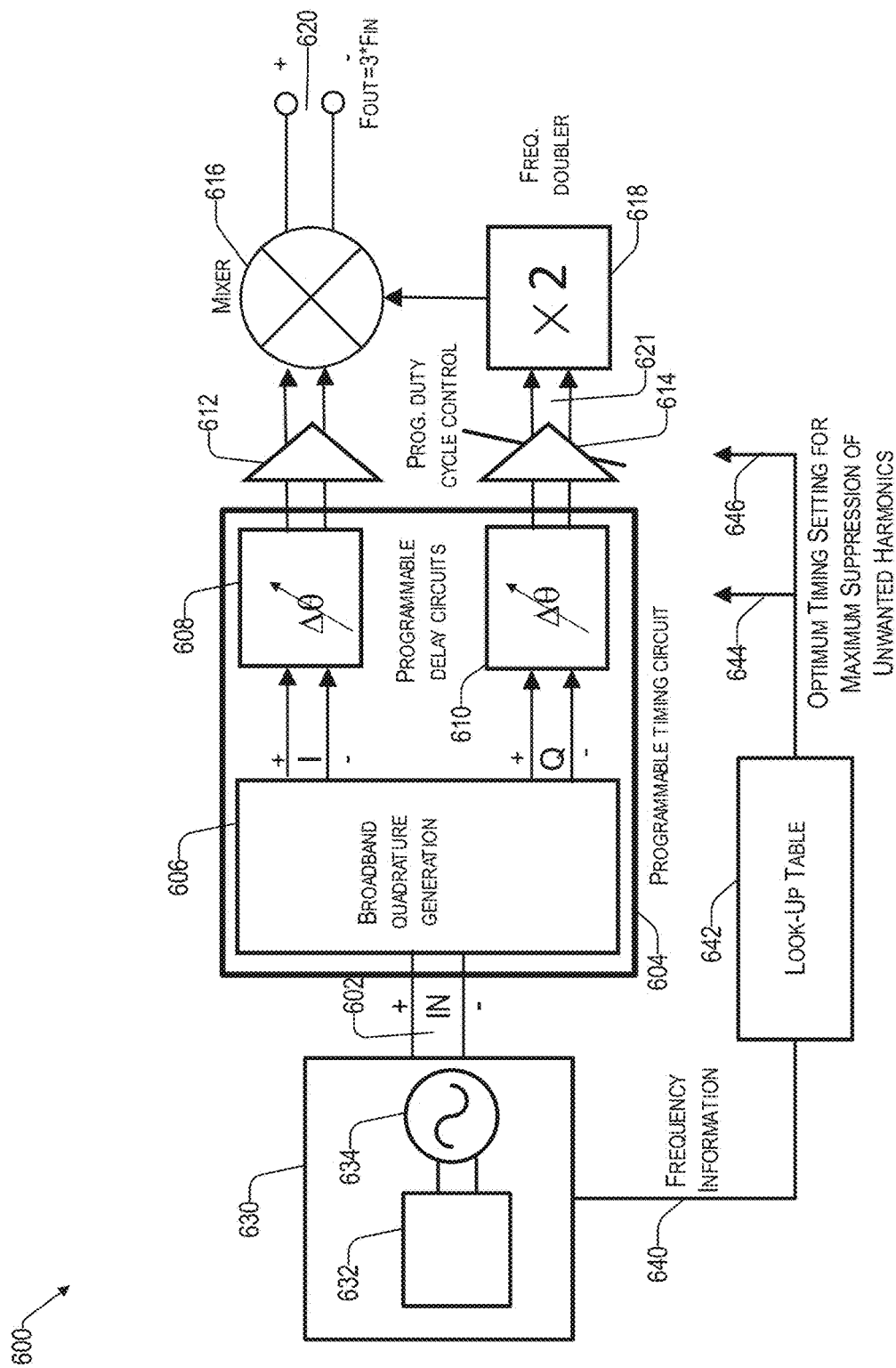
FIG. 6 is a block diagram of a frequency synthesizer based on a feed forward technique, consistent with an illustrative embodiment.

FIG. 6 is a block diagram of a frequency synthesizer 600 based on a feed forward technique, consistent with an illustrative embodiment. Several components of the frequency, synthesizer 600 are similar to those of FIG. 4 and are therefore not repeated here, for brevity. The frequency synthesizer 600 includes a digital phased locked loop (PLL) 630. The PLL 630 is a control system that generates an output signal 602 that is used as the input for the programmable timing circuit 604.

In one embodiment, the digital PLL 630 is not only an input source to the programmable timing circuit 604, but is also operative to adjust the programmable delay circuits 608 and 610, as well as the first and/or second buffers 612 and 614, to provide maximum suppression of unwanted harmonics. For example, there is a look up table 642 that has stored therein a set of values for at least one of the programmable delay circuits 608 and 610, and the first and/or second buffers 612 and 614, at different frequencies at the input 602. In this regard, a controller (that may be part of the PLL or separate therefrom) can use the look-up table 642 to make the appropriate adjustments to the programmable delay circuits 608/610 and/or/buffers 612/614 based on the predetermined settings in the look-up table 642. For example, the first and second programmable delay circuits 608 and 610 can be adjusted 644 individually for maximum conversion efficiency, and the second buffer 614 can be adjusted

646 for optimum harmonic suppression over a desired frequency range. Applicants have identified that frequency ramps spanning tens of GHz can be realized through frequency multiplication. In one embodiment, the frequency multiplication is odd.

In one example, the look-up table 642 is generated in a lab environment where the optimum settings for the programmable delay circuits 608/610 and buffer(s) 614 (and in some embodiments buffer 612) are identified for different input frequencies and stored in the look-up table 642. In this way, the predetermined settings can be applied via the look-up table 642 and frequency information 640 from the digital PLL 630. In one embodiment, the first buffer 612 has a duty cycle that is fixed at 50%, regardless of the frequency at the input 602.

In one embodiment, buffers 612 and 614 each comprise a CMOS inverter. In this regard, the duty cycle of the buffer can be adjusted by controlling the effective aspect ratio of the PFET vs. the NFET. For example, the weaker the effective mobility of the PFET (as compared to the effective mobility of the NFET), the shorter time the output of the buffer remains HI during a switching cycle for the same dimension of NMOS and PHOS. Thus, by virtue of controlling the symmetry of the PFET/NFU (e.g., by electronically controlling the effective aspect ratio of the PFET vs. the NFET by way of switches), the duty cycle of the buffer (e.g., 614) can be adjusted.

Example Constructive Destructive Addition of Frequency Elements

Reference now is made to FIGS. 7A to 7C, which illustrate aspects of an example optimization of phase shift for maximum conversion gain. In particular, FIG. 7A illustrates a mixer 702 having a first input operative to receive a first frequency ($V_{TOP}$), which includes $\omega$, $3\omega$, and $5\omega$ components, and a second input operative to receive a second frequency ($V_{BOT}$) that has been altered by a multiplier (e.g., doubler) 704. The even frequency multiplier 704 provides DC, $2\omega$, $4\omega$, etc. components. Thus, a non-ideal frequency multiplier (e.g., doubler) 704 and a mixer have different sets of frequency elements to generate the 3rd harmonics, as illustrated in FIG. 7B by way of an example table.

Thus, unlike an ideal scenario, where the mixer 702 only generates w and the doubler only generates $2\omega$, additional frequency components (i.e., harmonics) can be generated by the mixer 702 and multiplier (e.g., doubler) 704. Depending on the input phase between $V_{TOP}$ and $V_{BOT}$, each element can be added destructively or constructively and provided at the output, as illustrated in FIG. 7C, to provide the desired output harmonic (e.g., $3\omega$). For example, $\theta_1$ is a product of the DC signal of the frequency doubler and the $3\omega$ signal of the mixer 702. Further, $\theta_2$ is a product of the $2\omega$ harmonic of the frequency doubler 704 and the $\omega$ of the mixer 702. Element $\theta_3$ is the $4\omega$ harmonic of the frequency doubler 704 and the $-\omega$ of the mixer 702. The summing function 710 can be performed by the mixer 702. For example, elements $\theta_1$, $\theta_2$, and $\theta_3$ can be added or subtracted in various combinations, to generate a desired output.

For example, to maximize conversion efficiency all elements are added constructively (e.g., $\theta_1+\theta_2+\theta_3$). Stated differently, the summation of the vectors is maximized by constructively combining the vector contributions of the frequency multiplier 704 and the mixer 702. However, when elements $\theta_1$, $\theta_2$, and $\theta_3$ are not the same, then they are combined destructively as a vector sum (e.g., $\theta_1-\theta_2-\theta_3$). Similar principles can be applied to other harmonics.

Reference now is made to FIGS. 8A to 8C, which explain an example timing between a first input (e.g., $V_{IN\_TOP}$) and a second input (e.g., $V_{IN\_BOT}$) of a harmonic multiplier. FIG. 8A is a block diagram 800A of a mixer 802 configured to receive a first input VIN_TOP and a second input VIN_BOT via a multiplier (e.g., doubler) 804. FIG. 8B is a circuit implementation 800B of the block diagram of FIG. 8A using metal oxide semiconductor (MOS) devices, consistent with an illustrative embodiment. FIG. 8C is a timing diagram related to the circuit implementation of FIG. 8B.

The circuit 800B includes a top differential pair of transistors 812 and 814 and a bottom differential pair of transistors 816 and 818. The frequency doubler output current $I_E(T)$ at node 820 is provided by equation 1 below:

$$I_e(t) = a_0 + \sum_{n=1}^{\infty} a_n \cos(2n\omega_0 t) \qquad \text{(EQ. 1)}$$

Where:

$a_0 = I_0 r$, and $a_n = 2I_0/n\pi$.

The frequency tripler output current Io(t), represented by differential output 822, is provided by equation 2 below:

$I_o(t) = [\sin(\omega_0 t + \theta) - \frac{1}{3}\sin(3\omega_0 t + 3\theta) + \frac{1}{5}\sin(5\omega_0 t + 5\theta) - \ldots]I_e(t)$ \qquad (EQ. 2)

The harmonic content calculation for the frequency multiplier (e.g., doubler) output current $I_e(t)$ and the harmonic frequency tripler output current $I_o(t)$ are provided by equations 3 and 4 below:

$I_e(t) = a_0 + a_1 \cos(2\omega_0 t) + a_2 \cos(4\omega_0 t) + a_3 \cos(6\omega_0 t) +$ \qquad (EQ. 3)

Where:

$a_n = (2I_0/n\pi)\sin(n\pi r)$ $I_o(t) = [\sin(\omega_0 t + \theta) - \frac{1}{3}\sin(3\omega_0 t + 3\theta) + \frac{1}{5}\sin(5\omega_0 t + 5\theta) - \ldots]I_e(t)$ \qquad (EQ. 4)

The Ie(t) and $I_o(t)$ currents are low-pass filtered as a result of circuit 800B parasitics. In one embodiment, the low-pass characteristic can be described as a single pole system having a pole frequency of $\theta_{BW}$. After low-pass filtering, the frequency multiplier and tripler currents $I_e'(t)$ and $I_o'(t)$ are provided by equations 5 and 6, respectively:

$I_e'(t) = A_0 + A_{2\omega}\cos(2\omega_0 t) + A_{4\omega}\cos(4\omega_0 t) + A_{6\omega}\cos(6\omega_0 t) +$ \qquad (EQ. 5)

Where:

$A_{n\omega} = a_n * L(n\omega)$ $I_o'(t) = [L(\omega_0)\sin(\omega_0 t + \theta) + -\frac{1}{3}L(3\omega_0)\sin(3\omega_0 t + 3\theta) + \frac{1}{5}L(5\omega_0)\sin(5\omega_0 t + 5\theta) - \ldots]I_e'(t)$ \qquad (EQ. 6)

Figure 9:
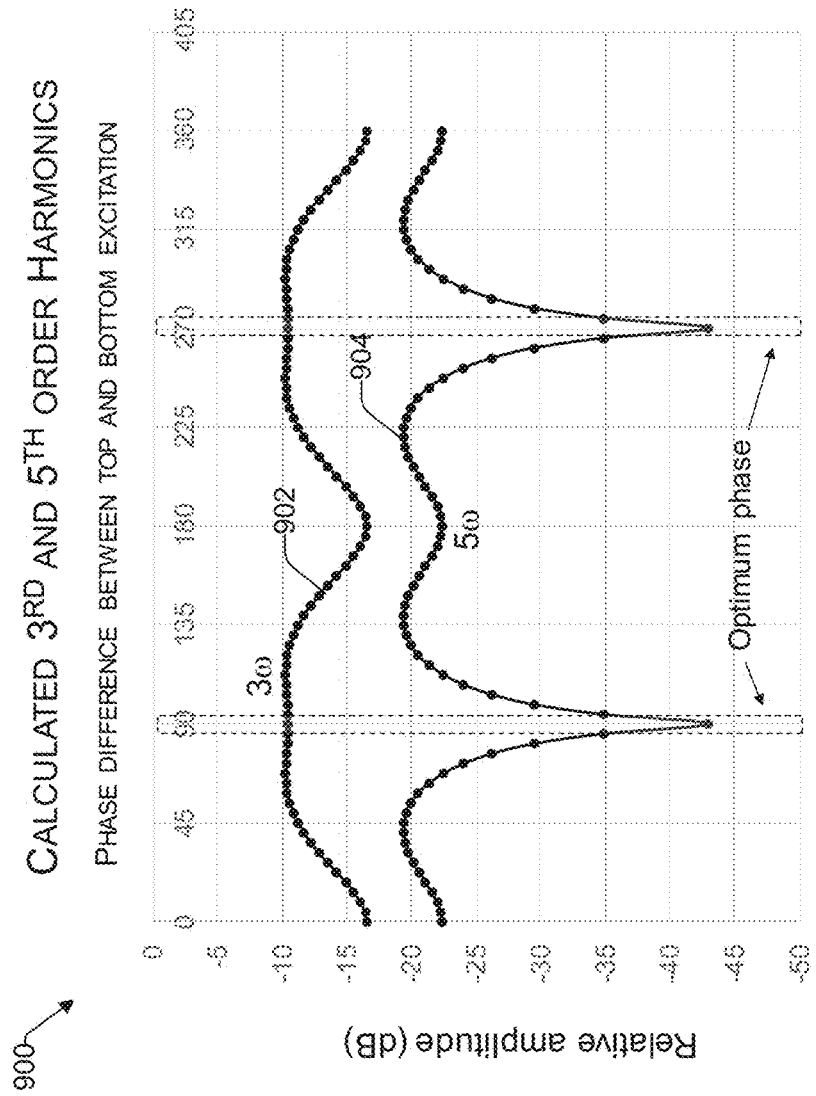
FIG. 9 is a graph of example calculation results of third and fifth order harmonics of a harmonic multiplier, consistent with an illustrative embodiment.

FIG. 9 is a graph of example calculation results of third and fifth order harmonics of a harmonic multiplier, consistent with an illustrative embodiment. Graph 900 illustrates that, for an optimum phase range (e.g., at approximately 90° and 270°), the undesired fifth order harmonic $5\omega$ 904 is substantially suppressed with respect to the desired third order harmonic $3\omega$ 902, which is afforded maximum conversion efficiency. In this regard, it is noted that the fifth order harmonic component may be sensitive to the phase shift. Accordingly, in one embodiment, a phase resolution of <10° is used. In the example of FIG. 9, the input frequency is 20 GHz, BW=40 GHz, and duty ratio=0.65.

Example Architecture

Figure 10:
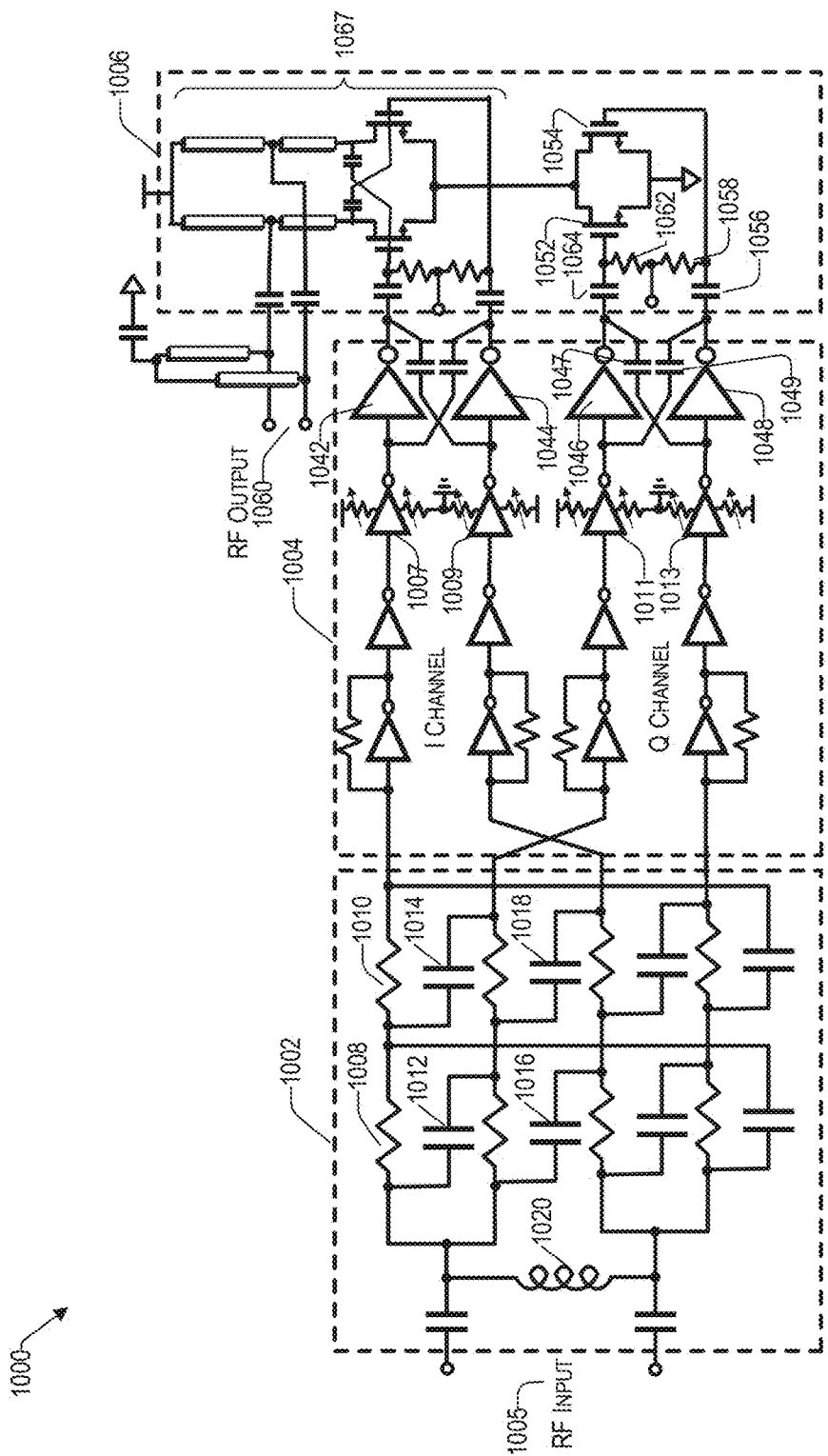
FIG. 10 is an example architecture of a harmonic multiplier, consistent with an illustrative embodiment.

FIG. 10 is an example architecture of a harmonic multiplier, consistent with an illustrative embodiment. By way of example only, and not by way of limitation, architecture 1000 is illustrated as a wide-band frequency tripler. Architecture 1000 includes a broadband two-stage poly phase quadrature filter (PQF) 1002, which corresponds to the quadrature generation block 406 in FIG. 4, to accommodate an RF input, a delay-programmable pre-amplifier 1004 (e.g., corresponding to the programmable delay circuits 408 and 410 in FIG. 4), a differential duty cycle controlled buffer 1048 and 1049, and an RF core 1006 comprising a mixer and frequency doubler (1052 and 1054). The PQF 1002 is a filter bank that splits the RF input signal 1005 to provide an in-phase channel (I) and a quadrature channel Q that is out of phase by 90° over a wide range of input frequency.

The delay-programmable pre-amplifier 1004 is coupled to the output of the PQF filter 1002. It includes a programmable delay circuitry 1007, 1009, 1011, and 1013 (which corresponds to the programmable delay circuits 408 and 410 of FIG. 4, respectively).

The RF core circuit 1006 includes a frequency doubler comprising a differential pair 1052 and 1054, as well as mixer 1067 at the top of the core circuit 1006.

Example Results

Figure 11:
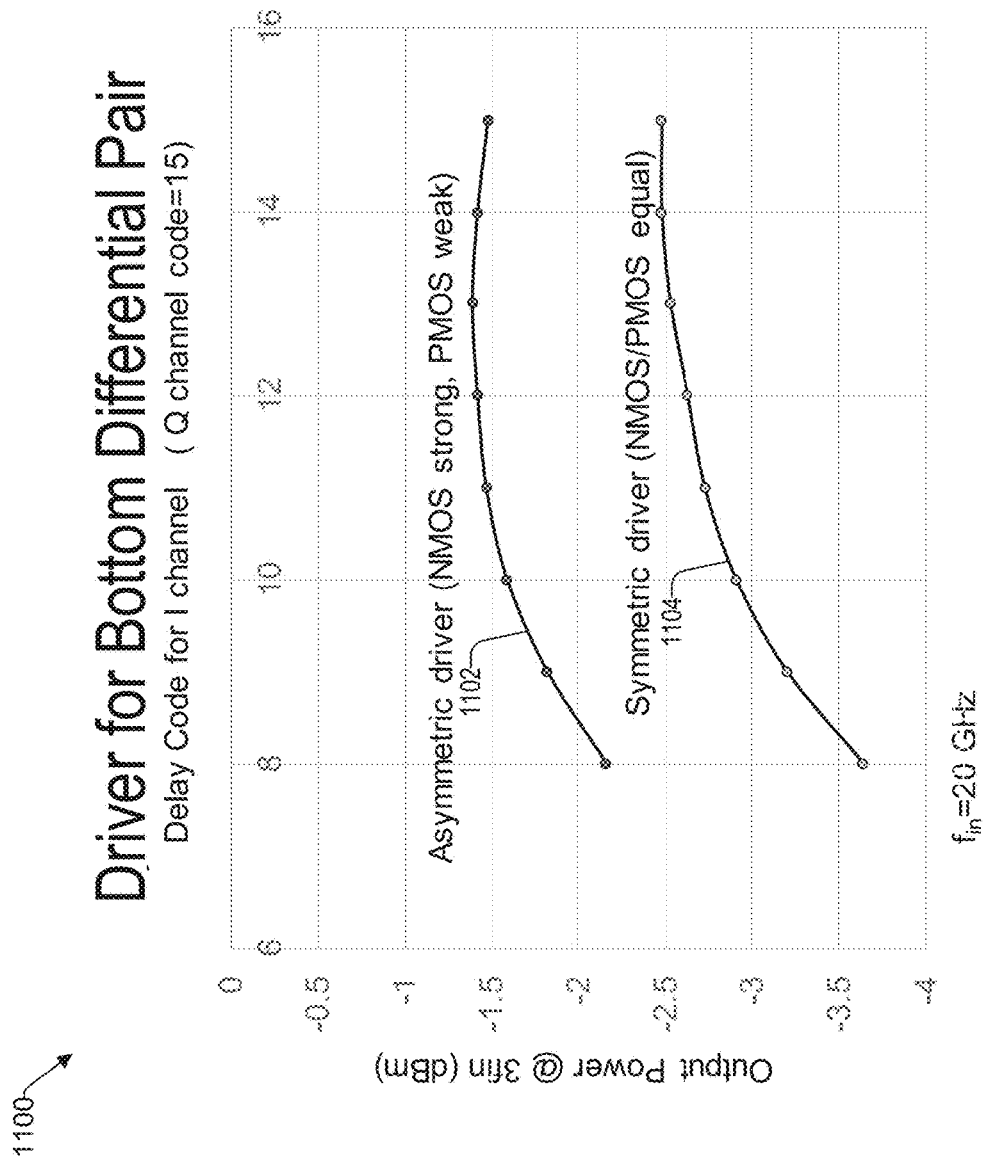
FIG. 11 illustrates a plot of output power at the third order harmonic frequency of a harmonic multiplier, where the frequency is fixed but the delay code for a programmable delay circuit is varied.

FIG. 11 illustrates a plot of output power at the third order harmonic frequency 1100 of a harmonic multiplier, where the input frequency is fixed but the delay code for the programmable delay circuit is varied. By way of example only, and not by way of limitation, the bottom programmable delay circuit (e.g., 410 in FIG. 4 or buffers 1046 and 1048 in FIG. 10) are adjusted. The plot of the asymmetric driver 1102 is a result of the programmable duty cycle control circuit 413. It will be understood that the top programmable delay circuit (e.g., 408 or buffers 1042 and 1044) can be adjusted as well. By varying the delay in the programmable delay circuit (e.g., 410), an optimal code can be identified for that particular frequency (e.g., 20 GHz). In one embodiment, this ideal code can be stored in a look-up table (e.g., 642 in FIG. 6). FIG. 11 further illustrates that an asymmetric driver, having a strong n-channel MOS (NMOS) and a weak p-channel MOS (PMOS), improves the conversion gain over the design with symmetric drivers 1104.

Figure 12:
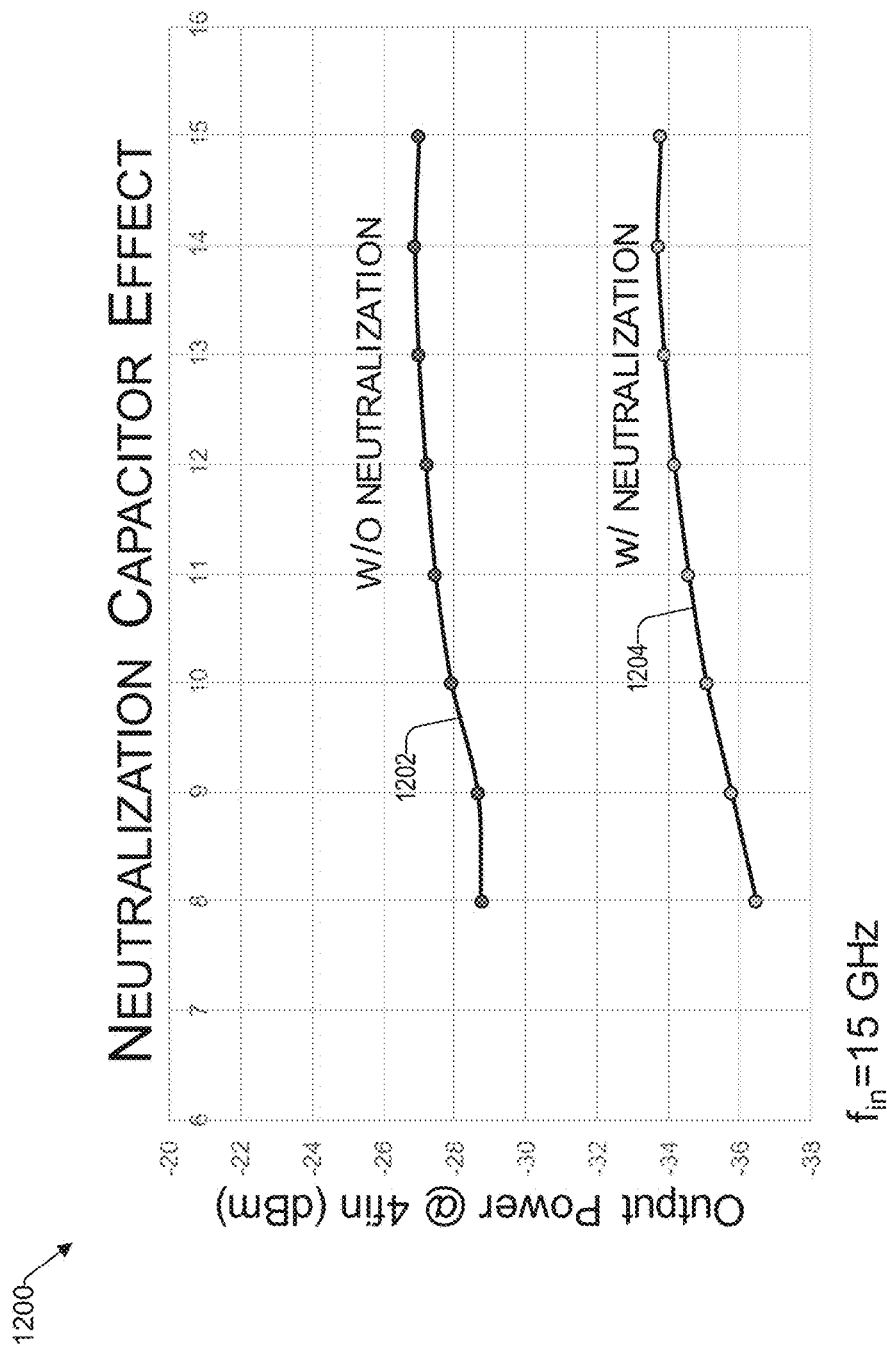
FIG. 12 illustrates a simulated output power, which shows that the neutralization capacitors of FIG. 10 improve the suppression of unwanted harmonics at the output.

FIG. 12 illustrates waveforms 1200 related to the effect of the neutralization capacitors of FIG. 10. To that end, FIG. 12 illustrates the output power at $4*f_{in}$ without neutralization 1202 and with neutralization 1204. Referring back to FIG. 10, for example, neutralization for the Q channel can be achieved by introducing capacitors 1047 and 1049 that are cross coupled between an input of the buffer 1046 of a first path of a differential path and the output of a buffer 1048 of a second path of the differential path. Stated differently, capacitors 1047 and 1049 are cross coupled between the inputs and the outputs of the buffers 1046 and 1048. The output power at the fourth harmonic is substantially reduced with neutralization (1304), as compared to a system without neutralization (1302). Accordingly, by virtue of neutralization, better harmonic rejection is achieved by leveraging the miller effect provided by the cross-coupled capacitors 1047 and 1049. In various embodiments, such neutralization may be used in the top differential path (e.g., I channel), bottom differential path (e.g., Q channel), or any combination thereof.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method.

While NFETS and PFETS are illustrated in some of the examples herein, these transistors were provided by way of example only, and not by way of limitation. It will be understood, based on the concepts disclosed herein, that other types of insulated-gate field effect transistors (IGFET) with complementary logic may be used as well. For example, any FETS from columns III-V of the periodic table, including carbon nanotube FETS could be used as well to implement the structures described herein.

Aspects of the present disclosure are described herein with reference to flowchart illustrations and/or block diagrams of methods, apparatus (systems), and computer program products according to embodiments of the application. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A harmonic frequency multiplier device, comprising:
    a programmable timing circuit having an input configured to receive an input signal having a frequency f, a first output operative to provide a signal that is in phase with the input signal, and a second output that is operative to provide a signal that is a time delayed version of the input signal, having the frequency f;
    a first buffer having an input coupled to the first output of the programmable tuning circuit and an output operative to provide a signal having the frequency f;
    a second buffer having an input coupled to the second output of the programmable timing circuit and an output configured to provide a duty cycled controlled signal having the frequency f;
    a frequency multiplier having an input coupled to the output of the second buffer and an output operative to provide a frequency nf, where n is a positive integer; and
    a mixer having a first input coupled to the output of the first buffer, a second input coupled to the output of the frequency multiplier, and an output operative to provide a higher-order frequency multiplied signal based on the frequencies f and nf.

2. The harmonic frequency multiplier of claim 1, wherein the programmable timing circuit comprises:
    a broadband quadrature generation circuit configured to provide an in-phase output and a quadrature output based on the input signal, each having the frequency f;
    a first programmable delay circuit having an input coupled to the in-phase output of the broadband quadrature generation circuit and configured to provide the first output of the programmable timing circuit; and
    a second programmable delay circuit having an input coupled to the quadrature output of the broadband quadrature generation circuit and configured to provide the second output of the programmable timing circuit.

3. The harmonic frequency multiplier of claim 2, wherein the first and second programmable delay circuits are configured to be adjusted for at least one of (i) a maximum conversion gain and (ii) suppression of one or more unwanted harmonics.

4. The harmonic frequency multiplier of claim 3, wherein the one or more unwanted harmonics include fifth-order harmonics of the input frequency f.

5. The harmonic frequency multiplier of claim 2, further comprising:

a phase locked loop (PLL) circuit operative to generate the input signal of the programmable timing circuit; and a look-up table coupled the PLL circuit and configured to adjust at least one of (i) the first programmable delay circuit, and (ii) the second programmable delay circuit, for maximum convergence efficiency.

6. The harmonic frequency multiplier of claim 5, wherein the look-up table is further configured to be used for adjusting at least one of (i) the first buffer, and (ii) the second buffer, for optimum harmonic suppression over a desired frequency range.

7. The harmonic frequency multiplier of claim 1, wherein the second buffer is adjusted based on an optimum harmonic suppression over a desired frequency range.

8. The frequency multiplier of claim 1, wherein the first buffer is configured to provide a duty cycled controlled signal at its output.

9. The harmonic frequency multiplier of claim 1, wherein the first buffer has a duty cycle that is fixed at 50%.

10. The harmonic frequency multiplier of claim 1, wherein the programmable timing circuit, the first buffer, the second buffer, the frequency multiplier, and the mixer operate with differential signals.

11. The harmonic frequency multiplier of claim 1, further comprising a controller coupled to the output of the mixer and configure to adjust a delay of the first programmable delay circuit and a delay of the second programmable delay circuit such that a maximum convergence efficiency is achieved.

12. The harmonic frequency multiplier of claim 1, wherein:
the harmonic frequency multiplier is an odd order harmonic multiplier;
the multiplier is an even order frequency multiplier; and
the mixer is a single-balanced mixer.

13. The harmonic frequency multiplier of claim 1, wherein:
the harmonic frequency multiplier is an odd order harmonic multiplier;
the multiplier is an even order frequency multiplier; and
the mixer is an odd order frequency multiplier.

14. The harmonic frequency multiplier of claim 1, wherein:
the harmonic frequency multiplier is an even order harmonic multiplier;
the multiplier is an odd order frequency multiplier; and
the mixer is a double balanced mixer.

15. The harmonic frequency multiplier of claim 1, wherein:
the harmonic frequency multiplier is an even order harmonic multiplier;
the multiplier is an odd order frequency multiplier; and
the mixer is a second odd order frequency multiplier.

16. A method of providing harmonic frequency multiplication using programmable timing circuit, a first buffer coupled to a first output of the programmable timing circuit, a second buffer coupled to a second output of the programmable timing circuit, a frequency multiplier coupled to an output of the second buffer, and a mixer coupled to an output of the first buffer and an output of the multiplier, the comprising:
receiving an input signal having a frequency f, by the programmable timing circuit;
providing a signal that is in phase with the input signal, at the first output of the programmable timing circuit;
providing a time delayed version of the input signal, having the frequency f, at the second output of the programmable timing circuit;
providing a signal having the frequency f at the output of the first buffer;
providing a duty cycled controlled signal having the frequency f at the output of the second buffer;
providing a frequency nf, where n is a positive integer, at the output of the multiplier; and
providing a higher-order frequency multiplied signal based on the frequencies f and nf, at the output of the mixer.

17. The method of claim 16, further comprising:
providing an in-phase output and a quadrature output based on the input signal, each having the frequency f, by a broadband quadrature generation circuit of the programmable timing circuit;
providing the first output of the programmable timing circuit by a first programmable delay circuit configured to receive the in-phase output of the broadband quadrature generation circuit; and
providing the second output of the programmable timing circuit by a second programmable delay circuit configured to receive the quadrature output of the quadrature output of the broadband quadrature generation circuit.

18. The method of claim 17, further comprising adjusting, by the first and second programmable delay circuits, for at least one of (i) a maximum conversion gain and (ii) suppression of one or more unwanted harmonics.

19. The method of claim 17, further comprising, adjusting at least one of: (i) the first programmable delay circuit, and (ii) the second programmable delay circuit, for maximum convergence efficiency, based on predetermined values stored in a look-up table for different frequencies of the input signal.

20. The method of claim 19, further comprising, adjusting at least one of: (i) the first buffer, and (ii) the second buffer, for optimum harmonic suppression over a desired frequency range, based on the look-up table.

* * * * *